United States Patent
Geier et al.

(10) Patent No.: US 8,184,879 B2
(45) Date of Patent: May 22, 2012

(54) PARALLEL MRI INVOLVING DENSITY WEIGHTING OR ACQUISITION WEIGHTING

(76) Inventors: Oliver Geier, Langhus (NO); Dietbert Hahn, Kuernach (DE); Herbert Koestler, Retzbach (DE)

( * ) Notice: Subject to any disclaimer, the term of this patent is extended or adjusted under 35 U.S.C. 154(b) by 951 days.

(21) Appl. No.: 12/161,034

(22) PCT Filed: Jan. 4, 2007

(86) PCT No.: PCT/EP2007/000038
§ 371 (c)(1), (2), (4) Date: Jul. 16, 2008

(87) PCT Pub. No.: WO2007/085342
PCT Pub. Date: Aug. 2, 2007

(65) Prior Publication Data
US 2010/0034447 A1  Feb. 11, 2010

(30) Foreign Application Priority Data
Jan. 27, 2006 (DE) .......................... 10 2006 004 196

(51) Int. Cl.
*G06K 9/00* (2006.01)
*G01V 3/00* (2006.01)
(52) U.S. Cl. ........................................ 382/128; 324/309
(58) Field of Classification Search .......... 382/100–154; 324/300–322
See application file for complete search history.

(56) References Cited

U.S. PATENT DOCUMENTS
7,750,632 B2 * 7/2010 Qian et al. ................... 324/307

FOREIGN PATENT DOCUMENTS
| EP | 1 236 436 | 9/2002 |
| WO | WO 03/093854 | 11/2003 |
| WO | WO 2005/003803 | 1/2005 |

OTHER PUBLICATIONS

"Parallel Acquisition for Effective Density Weighted Imaging: PLANED Imaging," Oliver M. Geier et al, Magn Reson Mater Phy (2007), pp. 19-25.
"Direct Parallel Imaging Reconstruction of Radially Sampled Data Using GRAPPA with Relative Shifts," Griswold et al., Proc. Intl. Soc. Mag. Reson. Med. 11 (2003) p. 2349.
"Optimal Sampling In Parallel Magnetic Resonance Imaging," Aggarwal et al—II-839-II-842.
"Inherently Self-Calibrating Non-Cartesian Parallel Imaging," Yeh et al—Magnetic Resonance in Medicine (2005) pp. 1-8.
"Advances in Sensitivity Encoding With Arbitrary k-Space Trajectories," Pruessmann et al, Magnetic Resonance in Medicine, (2001) pp. 638-651.
"Sensitivity Profiles From an Array of Coils for Encoding and Reconstruction in Parallel (SPACE RIP)," Kyriakos et al., Magnetic Resonance in Medicine (2000), pp. 301-308.

(Continued)

*Primary Examiner* — Dixomara Vargas
(74) *Attorney, Agent, or Firm* — Schiff Hardin LLP (57) ABSTRACT

In a method for magnetic resonance imaging, k-space is sampled using density weighted data acquisition or acquisition weighted data acquisition, with at least one region of k-space being intentionally undersampled with respect to the Nyquist criterion. Reconstruction of the MR image is performed using a parallel imaging method, with the influence in the reconstructed image of the missing k-space data, as a result of the undersampling, being reduced.

7 Claims, 8 Drawing Sheets

OTHER PUBLICATIONS

"AUTO-SMASH: A Self-Calibrating Technique for SMASH Imaging," Jakob et al, MAGMA, Magnetic Resonance Materials in Physics, Biology and Medicine 7 (1998) pp. 42-54.

"Generalized Autocalibrating Partially Parallel Acquisitions (GRAPPA)," Griswold et al, Magnetic Resonance in Medicine, (2002) pp. 1202-1210.

"The Power Spread Function Effect on Low Resolution Sensitivity Encoded Imaging," Zhao et al, Proc. Intl. Soc. Mag. Reson. Med 9 (2001), p. 1799.

"Efficient k-Space Sampling by Density-Weighted Phase-Encoding," Greiser et al, Magnetic Resonance in Medicine (2003) pp. 1266-1275.

"Reconstructing MR Images From Undersampled Data: Data-Weighting Considerations," Magnetic Resonance in Medicine (2000) pp. 867-875.

"Dynamic Autocalibrated Parallel Imaging Using Temporal GRAPPA (TGRAPPA)," Breuer et al, Magnetic Resonance in Medicine, (2005) pp. 981-985.

"Auto-SENSE View-Sharing Cine Cardiac Imaging," Köstler et al, MAGMA (2004)—Short Communication.

"Fast Parallel Image Reconstructions with non-Cartesian Trajectories," Heidemann et al, Proc. Intl. Soc. Mag. Reson. Med. 11 (2003) p. 2347.

"Tailored SMASH Image Reconstructions for Robust In Vivo Parallel MR Imaging," Sodickson, Magnetic Resonance in Medicine (2000), pp. 243-251.

"Parallel Imaging Reconstruction Using Automatic Regularization," Lin et al, Magnetic Resonance in Medicine, (2004), pp. 559-567.

"3Parallel Magnetic Resonance Imaging with Adaptive Radius in k-Space (PARS): Constrained Image Reconstruction using k-Space Locality in Radiofrequency Coil Encoded Data," Yeh et al, Magnetic Resonance in Medicine, (2005), pp. 1383-1392.

"Adaptive Sensitivity Encoding Incorporating Temporal Filtering (TSENSE)," Kellman et al., Magnetic Resonance in Medicine, (2001), pp. 846-852.

"Parallel Acquisition Techniques with Modified Sense Reconstruction mSense," Wang et al,, p. 89.

"Spatial Resolution in Spectroscopic Imaging," Kicnlin et al, pp. 1-20.

"Auto-SENSE Perfusion Imaging of the Whole Human Heart," Köstler et al, Journal of Magnetic Resonance Imaging, (2003) pp. 702-708.

"Partially Parallel Imaging With Localized Sensitivities (PILS)," Griswold et al, Magnetic Resonance in Medicine, (2000) pp. 602-609.

"SENSE: Sensitivity Encoding for Fast MRI," Pruessmann et al, Magnetic Resonance in Medicine, (1999), pp. 052-062.

"VD-AUTO-SMASH Imaging," Heidemann et al, Magnetic Resonance in Medicine, (2001) pp. 1066-1074.

"Sampling Density Compensation in MRI: Rationale and an Iterative Numerical Solution," Pipe et al, Magnetic Resonance in Medicine (1999), pp. 170-186.

"Selection of a Convolution Function for Fourier Inversion Using Gridding," Jackson et al, IEEE Transactions on Medical Imaging, vol. 10, No. 3, Sep. 1991.

"Accurate Phosphorus Metabolite Images of the Human Heart by 3D Acquisition-Weighted CSI," Pohmann et al, Magnetic Resonance in Medicine, (2001), pp. 817-826.

"Essential Considerations for Spectral Localization Using Indirect Gradient Encoding of Spatial Information," Mareci et al, Journal of Magnetic Resonance 92, (1991), pp. 229-246.

"Motion Correction With PROPELLER MRI: Application to Head Motion and Free-Breathing Cardiac Imaging," James G. Pipe, Magnetic Resonance in Medicine, (1999), pp. 963-969.

"Efficient k-Space Sampling by Density-Weighted Phase-Encoding," Greiser et al, Magnetic Resonance in Medicine, (2003), pp. 1266-1275.

* cited by examiner

PARALLEL MRI INVOLVING DENSITY WEIGHTING OR ACQUISITION WEIGHTING

BACKGROUND OF THE INVENTION

1. Field of the Invention

The present invention concerns a method of MR imaging (MR, magnetic resonance).

2. Description of the Prior Art

In MR imaging based on the phenomenon of nuclear magnetic resonance, the test object is exposed to a static homogeneous magnetic field, whereby the atom's nuclear spins, which at first are randomly oriented, align along the axis of the static magnetic field. The ordered nuclear spins are excited by magnetic high frequency fields. For image formation, the nuclear spin signal is recorded as a voltage which is induced into one or several coils under the influence of a suitable sequence or progression of high frequency and gradient pulses in the time domain. Finally, the image reconstruction in general is carried out by means of a Fourier transform of the time signals. The number, the time interval, the duration and the strength of the gradient pulses employed define the mode of sampling of the reciprocal so-called "k-space", which in turn determines the FOV (field of view) to be imaged as well as the image resolution.

In the advancement of the art of MR imaging methods, numerous efforts have already been made to shorten the image acquisition time and/or to improve the achievable spatial resolution.

To accelerate the imaging process, parallel MR techniques for example take advantage of the phenomenon that the spatial sensitivity profile of the receiver coils provides the nuclear spin signal with spatial information, which can be used for the image reconstruction. By using in parallel several separate receiver coils, each with a different sensitivity profile, and combining the respective nuclear spin signals detected, the acquisition time for an image can be reduced in comparison to a conventional reconstruction by a factor which is limited by the number of receiver coils and their spatial arrangement.

Further, for MR images where the side lobes of the SRF (spatial response function) entail severe contamination, it has been proposed to use a k-space filter which enhances the data in the centre of the k-space. While this filtering reduces the side lobes of the SRS and thereby the contamination from neighbor voxels, it also affects the spatial resolution and reduces the signal to noise-ratio (SNR). One approach to overcome this problem involves the use of density weighted or acquisition weighted imaging methods. This way, k-space filtering is already applied during data acquisition. If acquisition weighted methods are employed, the Nyquist criterion is generally met in the entire k-space. However, due to the greater number of acquisitions in the centre of the k-space and the need for a greater number of phase encoding steps for the same size of the FOV and the same spatial resolution as in an unweighted method, the minimum number of scans is restricted and thereby limited to the shortest recording duration. To overcome this problem, Greiser and von Kienlin have introduced the density weighted phase encoding method, which is described in more detail in the article "Greiser A, von Kienlin M., Efficient k-space Sampling by Density-Weighted Phase-Encoding. Magn Reson Med 2003; 50:1266-1275". In contrast to the acquisition weighted methods, this method is based on the variation of the density of the sampling points in the k-space. The acquisition weighted sampling is a density weighted sampling in which specifically the k-space density is varied by a variable number of acquisitions on a fixed k-space grid. The density weighted sampling has proven to be a highly efficient method of k-space sapling. The modification of the sampling scheme makes it possible to improve the shape of the SRF and thereby the localisation properties. In the kind of density weighted sampling presently known, some parts of the k-space violate the Nyquist criterion, which entails undersampling artefacts.

SUMMARY OF THE INVENTION

The object of the present invention is to suggest a method in which the above-mentioned drawbacks can at least partially be eliminated.

The above object is achieved in accordance with the present invention by a method of magnetic resonance imaging that includes the step of sampling the k-space using density weighted data acquisition, which includes acquisition weighted data acquisition, wherein in the sapling at least one region of the k-space is undersampled with respect to the Nyquist criterion. According to the invention, the reconstruction of the MR image is performed at least in part with the aid of a parallel MR imaging method. Thereby, in the image the influence of the missing k-space data required to fulfil the Nyquist criterion is at least partly reduced. For example, the k-space data missing in a part of the undersampled region and required to meet the Nyquist criterion can be reconstructed or the image can be deconvoluted on a greater FOV.

The parallel MR imaging method replaces at least partially the very time-consuming spatial encoding. This way, only a fraction of the samples, generally phase encoding steps, must be performed, which yields an acceleration of the image acquisition while the full spatial resolution is maintained. In the acquisition weighted data acquisition, where otherwise the Nyquist criterion is fulfilled over the entire k-space, the sampling density is reduced and the violation of the Nyquist criterion at least in parts of the k-space is deliberately accepted. In the density weighted imaging as well, the Nyquist criterion is knowingly violated.

In one embodiment, in the parallel imaging method missing k-space lines are reconstructed for example by means of a SMASH- (Simultaneous acquisition of spatial harmonics), Auto-MASH, (Autocalibrating simultaneous acquisition of spatial harmonics), VD-Auto-SMASH-Variable density autocalibrating simultaneous acquisition of spatial harmonics), GRAPPA-Generalized Autocalibrating Partially Parallel Acquisitions), or a GRAPPA-operator-logarithm.

In a further embodiment, in the parallel MR imaging method the reconstruction is performed in the real-space, for example with a SENSE-, Auto-SENSE-, mSENSE- (modified sensitivity encoding), T-SENSE- (Adaptive sensitivity encoding incorporating temporal filtering) oder PILS- (Partially parallel imaging with localized sensitivities) algorithm.

In another embodiment, in the parallel MR imaging method the reconstruction is performed in the real-space as well as in the k-space, for example with the SPACE-RIP method (Sensitivity profiles from an array of coils for encoding and reconstruction in parallel).

In a further embodiment, the method of magnetic resonance imaging comprises a spectroscopic imaging method, for example chemical shift imaging.

In a further embodiment, the density weighted and the acquisition weighted sampling, respectively, are accomplished by using means of phase encoding steps.

In a further embodiment, the density weighted and the acquisition weighted sampling, respectively, ensues not only by means of phase encoding steps but also, for example, by means of radial of spiral k-space sampling, or sampling according to the PROPELLER (Periodically Rotated Overlapping ParallEL Lines with Enhanced Reconstruction) technique (Pipe J G. Motion correction with PROPELLER MRI: Application to head motion and freebreathing cardiac imaging. Magn Reson Med 1999; 42: 963:969).

In a further embodiment, in the density weighted and the acquisition weighted sampling, respectively, the Nyquist criterion is violated in the entire k-pace.

In a further embodiment, the method includes an optimized density weighted and the acquisition weighted sampling mode, respectively, in case the signal intensity encoded in the k-space varies due to the imaging methods, as for example in RARE (rapid acquisition with relaxation enhancement), FSE (Fast spin echo), TSE (Turbo spin echo) oder EPI (Echo planar imaging) methods, or in case the noise in the reconstruction depends on the k-space density, for example a noise amplification factor g depending on an acceleration factor in parallel imaging.

In a further embodiment, the density weighted and the acquisition weighted sampling, respectively, ensue with the data in the center of the k-space not being enhanced, as for example when the density distribution corresponds to an edge enhancement filter.

The method according to the invention combines the benefits of the density weighted and the acquisition weighted sampling mode, respectively, with the benefits of the parallel imaging methods. In comparison with imaging methods that make use of a uniform sampling mode, the method according to the invention at the same nominal spatial resolution and the same number of scans yields a noticeable reduction of aliasing artefacts and, depending on the size of the specimen, an improved SNR (signal to noise-ratio).

The method according to the invention can be applied in one, two, or three spatial dimensions.

The method according to the invention can for example be used in conventional MR-imaging or spectroscopic MR-imaging, but also in MR angiography, dynamic or functional MR imaging or in phase contrast techniques.

DESCRIPTION OF THE PREFERRED EMBODIMENTS

EXAMPLE 1

Figure 1:
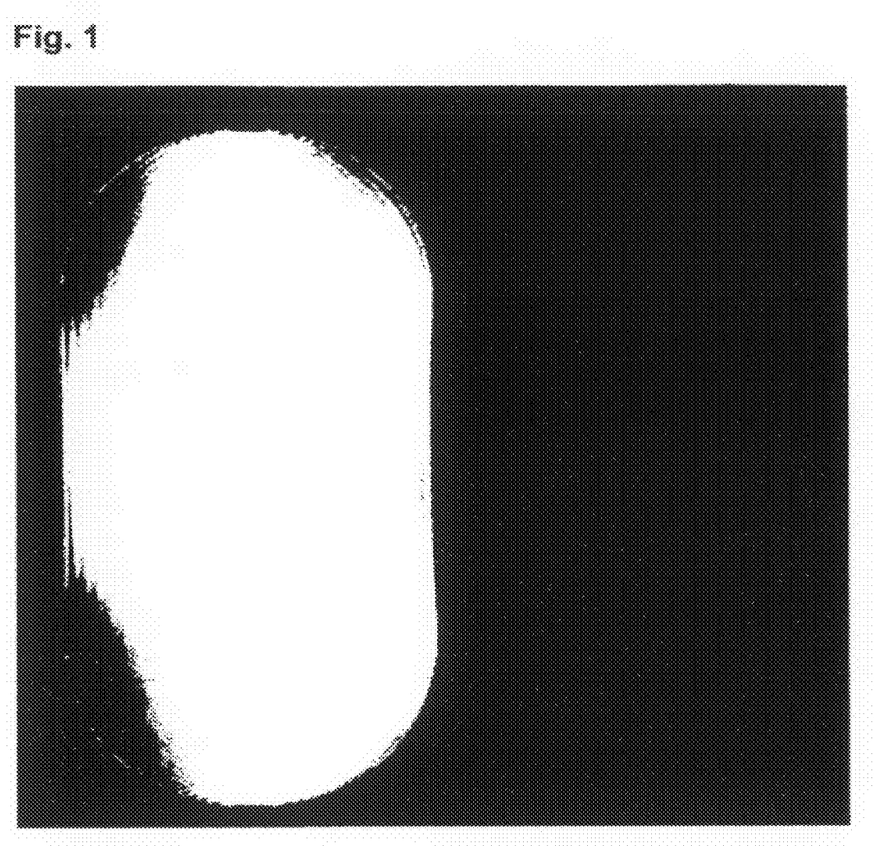
FIG. 1 is the image of a test object, recorded by a conventional method.

FIG. 1 shows the image of a test object formed by a conventional spin echo method with 256 phase encoding steps in horizontal direction. At the edges, a line pattern can be observed, which is a result of the absence of the spatial frequencies. Such artifacts are also called truncation- or Gibbs-artefacts.

Figure 2:
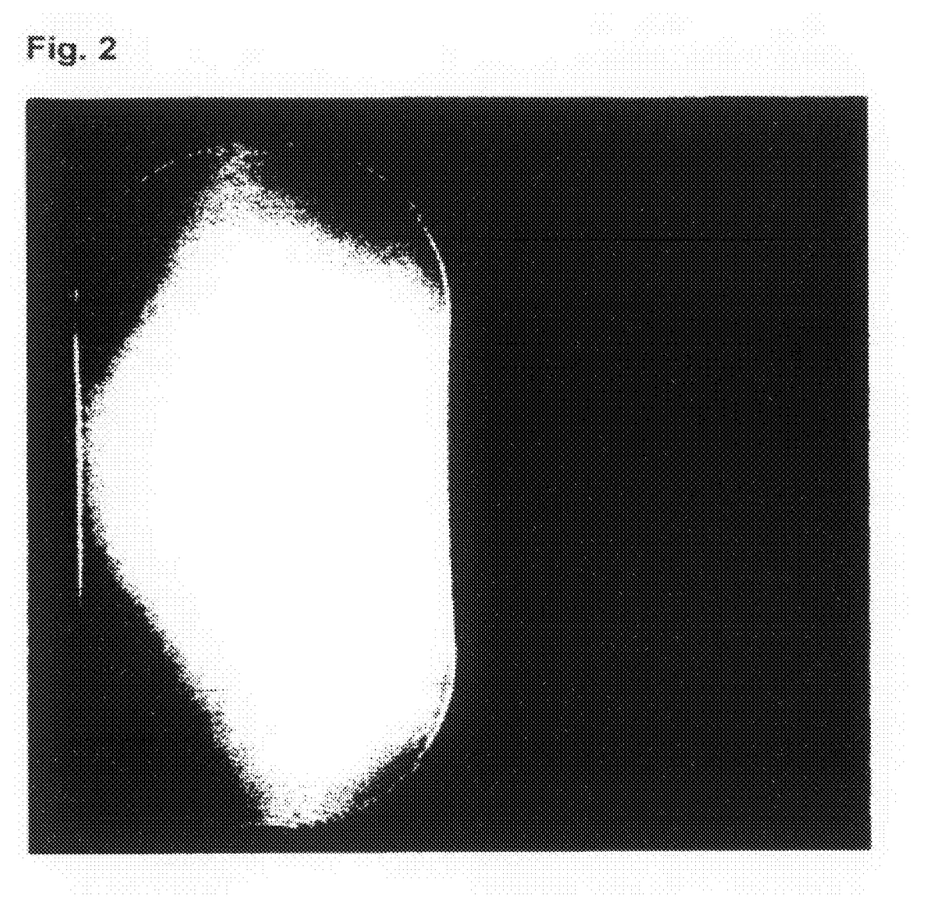
FIG. 2 is the image of the same test object as in FIG. 1, recorded with the method according to the invention.

FIG. 2 shown the image of the same test object as in FIG. 1, the acquisition of the image, however, was now performed according to the example described below. In comparison to FIG. 1, the artifacts are now considerably less pronounced and the signal to noise-ratio has significantly improved.

The method according to the invention includes the step of density weighted or acquisition weighted sampling. In contrast to an MR experiment with a uniformly weighted k-space acquisition, the acquisition weighted and the density weighted encoding uses a continuous weighting function. This makes it possible to optimise the SRF by means of using certain weighting functions as for example the Hanning- or the Gauss-functions. In the described example, a Hanning filter was used (see Mareci T H, Brooker H R. Essential considerations for spectral localization using indirect gradient encoding of spatial information. J Magn Reson 1991; 92: 229-246). For an acquisition weighted experiment, this weighting function is given by (see Pohmann R, von Kienlin M. Accurate phosphorous metabolite images of the human heart by 3D acquisition-weighted CSI. Magn Reson Med 2001; 45:817-826):

$$w(k) = \frac{\Delta x_{nom} \beta}{2} NA_{tot}\left(1 + \cos\left(2\pi \frac{k \cdot \Delta x_{nom}}{\alpha}\right)\right).$$

To compare an unweighted experiment with an experiment that uses a non-uniform weighting, the nominal resolution $\Delta x_{nom}$, which in analogy to the optical resolution is given at 64% of the width of the SRF (see Kienlin M, Pohmann R Spatial resolution in spectroscopic imaging. In: Blümler P, Blümich B, Botto R, Fukushima E editors. Spatially resolved magnetic resonance, Weinheim: Wiley-VCH; 1998), and the total number of acquisitions must be the same in both cases.

In the mentioned example, the phase encoding steps were recorded density weighted in horizontal direction, i.e. the data acquisition yielded a data set in a non-Cartesian k-space. In the acquisition, the minimum density was limited to one third of the Nyquist density.

For reconstruction, the data was transferred into the x-$k_y$-space by means of a Fourier transform in reading direction.

The k-space recorded in this example and the x-$k_y$-space can be divided in regions where the Nyquist criterion is met or exceeded and regions where the Nyquist criterion is violated. In order to be able to apply conventional FFT (fast Fourier transform) algorithms for the reconstruction in the y-direction, the samples which are obtained by density weighted imaging are transferred to a Cartesian grid. To this end, a gridding algorithm as described in "Jackson JI, Meyer CH, Nishimura DG. Selection of a Convolution Function for Fourier Inversion Using Gridding. IEEE Transactions On Medical Imaging 1991;10:473:478" has been applied in the region of the k-space was the Nyquist criterion of met or exceeded.

Besides the step of acquisition weighted or density weighted imaging, the method according to the invention also comprises the step of a parallel imaging method. In the regions of the k-space where the Nyquist criterion is violated in the density weighted data acquisition, in the present embodiment the Cartesian lines required to achieve the Nyquist rate are reconstructed with the aid of the GRAPPA technique. In the embodiment, 4 neighbour lines were used to reconstruct the missing lines: "Griswold M A, Jakob P M, Heidemann R M, Nittka M, Jellus V, Wang J, Kiefer B, Haase A. Generalized Autocalibrating Partially Parallel Acquisitions (GRAPPA). Magn Reson Med 2002; 47:1202:1210". Thus, in the entire area a Cartesian k-space exists, in which the Nyquist criterion is met. In this embodiment, for image formation the k-space completely filled by the above method is multiplied with a filter according to the SRF so that the k-space density distribution (Fourier transform of the SRF) is essentially rebuilt. Instead of reconstructing over a Cartesian k-space with density correction it is also possible to reconstruct over a dense, non-Cartesian and not density-corrected k-space or over a dense, Cartesian and not density-corrected k-space.

In this example, in the oversampled regions of the k-space the reconstruction of a k-space is performed by means of known methods (regridding) with density correction. Methods for density correction are discussed in "Pipe G P, Menon P. Sampling Density Compensation in MRI: Rationale and an Iterative Numerical Solution. Magn Reson Med 1999; 41:179:186". In this oversampled region the GRAPPA factors are determined.

Instead of GRAPPA factors, equivalent information such as coil profiles can be used. Instead of the oversampled regions, such information can also be obtained from prescans or additionally recorded k-space lines.

It should be noted that in principle methods where the reconstruction is performed in the k-space by means of reconstructing additional lines in the k-space as well as methods where the reconstruction is performed in the real-space into an expanded FOV, as for example in SENSE, can be used as parallel MR imaging methods, as well as so-called hybrid methods, which can be performed in the real-space as well as in the k-space. Exemplarily, the following articles are referred to:

Jakob P M, Griswold M A, Edelman R R, Sodickson D K. AUTO-SMASH: A self-calibrating technique for SMASH imaging. Simultaneous acquisition of spatial harmonics. Magma 1998; 7:42:54;

Heidemann R, Griswold M, Haase A, Jakob P M. VD-Auto-SMASH imaging. Magn Reson Med 2001; 45:1066-1074;

Griswold M A, Jakob P M, Heidemann R M, Nittka M, Jellus V, Wang J, Kiefer B, Haase A. Generalized Autocalibrating Partially Parallel Acquisitions (GRAPPA). Magn Reson Med 2002; 47:1202:1210;

Kyriakos W E, Panych L P, Kacher D F, et al. Sensitivity profiles from an array of coils for encoding and reconstruction in parallel (SPACE RIP) Magn Reson Med. 2000; 44:301-308;

Pruessmann K P, Weiger M, Scheidegger M B, Boesiger P. SENSE: sensitivity encoding for fast MRI. Magn Reson Med 1999; 42:952:962, Pruessmann K P, Weiger M, Bornert P, Boesiger P. Advances in sensitivity encoding with arbitrary k-space trajectories. Magn Reson Med 2001; 46:638:651;

Griswold M A, Jakob P M, Nittka M, Goldfarb J W, Haase A. Partially parallel imaging with localized sensitivities (PILS). Magn Reson Med 2000; 44: 602:609;

H. Köstler, J. Sandstede, C. Lipke, W. Landschütz, M. Beer, D. Hahn. AUTO-SENSE Perfusion Imaging of the Whole Human Heart. J. Magn. Reson. Imaging 2003; 18:702: 708;

Wang J, Kluge T, Nittka MJellus V, Kuehn B, Kiefer B, Parallel acquisition techniques with modified SENSE reconstruction (mSENSE). Proceedings of the 1st Würzburg workshop on parallel imaging, Würzburg 2001; 92; and Kellman P, Epstein F H, Mc Veigh E R. Adaptive sensitivity encoding incorporating temporal filtering (TSENSE), Magn Reson Med 2001; 45: 846:852.

It is further conceivable to use an inherently self-calibrating method for non-Cartesian parallel imaging (see Yeh E N, Stuber M, McKenzie C A, Botnar R M, Leiner T, Ohliger M A, Grant A K, Willig-Onwuachi J D, Sodickson D K. Inherently Self-Calibrating Non-Cartesian Parallel Imaing. Magn Reson Med 2005; 54:1-8).

Further it is conceivable to perform a reconstruction according to the method described in the article "Pruessmann K P, Weiger M, Scheidegger M B, Boesiger P. SENSE: sensitivity encoding for fast MRI. Magn Reson Med 1999; 42:952:962." The iterative non-Cartesian sensitivity encoding algorithm is, however, used without density correction for the reconstruction of spirally and radially sampled images according to the method of the invention.

Figure 3:
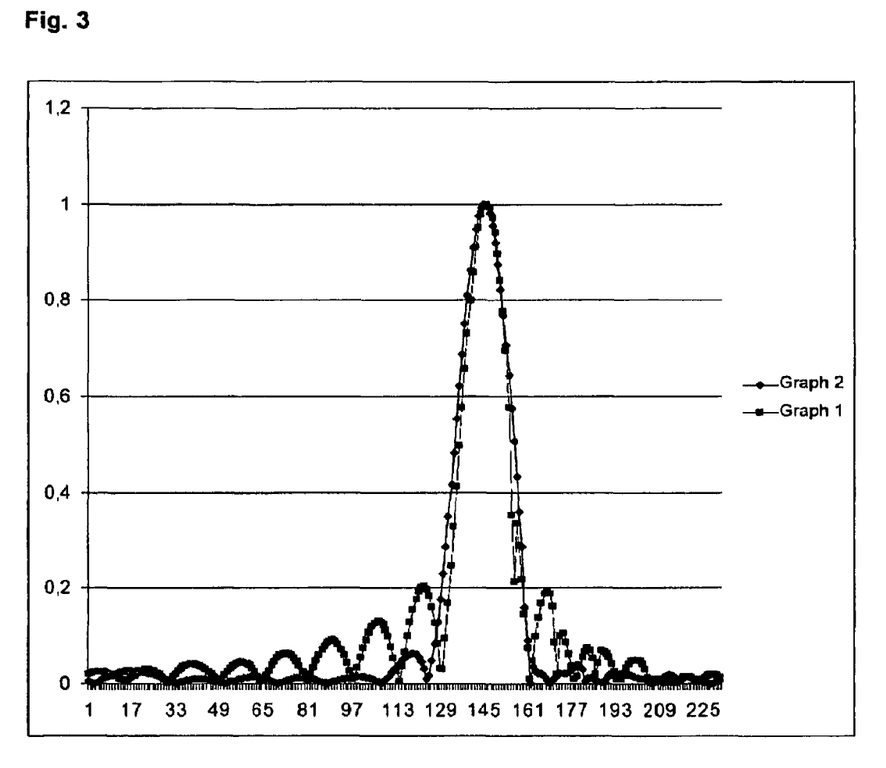
FIG. 3 is the graphical representation of the contributions to the SRF for the conventional method and the method according to the invention.

FIG. 3 shows a graphical representation of the contributions to the SRF which were obtained from the edge spread function for the conventional method (graph 1) and the method according to the invention (graph 2). Both images show a virtually identical image resolution, which corresponds to the width of the SRF graphs. Further, it can clearly be seen that the truncation artefacts are considerably less pronounced in the method according to the invention as compared to the conventional method.

EXAMPLE 2

Figure 4:
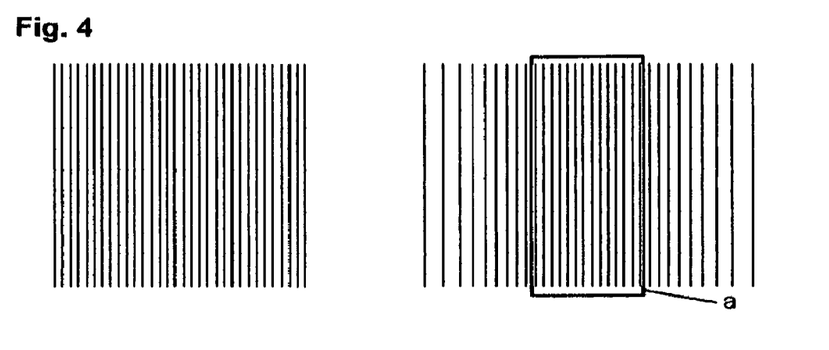
FIG. 4 is a schematic representation of the sampling for non-weighted Cartesian imaging (left) and for PLANED imaging (right). The rectangle a shows the part of the k-space where the Nyquist criterion is fulfilled.

PLANED imaging combines density weighted imaging with parallel imaging techniques. In contrast to conventional Cartesian imaging (see FIG. 4 left) in PLANED imaging, the k-space sampling is performed in a density weighted manner (see FIG. 4 right). In order to achieve the same resolution as for an image acquired with a Cartesian sampling, i.e. the SRF at 64% of maximum intensity has the same width, $k_{y,max}$ has to be chosen larger in PLANED imaging (see supra Greiser A and von Kienlin M, 2003). The basic idea of PLANED imaging is to fill the gaps of the undersampled parts of k-space by parallel imaging techniques, such as GRAPPA (see supra Griswold M A et al., 2002) or SENSE (see supra Pruessmann K P et. al, 1999) to avoid undersampling artefacts while maintaining the distribution of the sampling density defined by the weighting function.

If an oversampled part of k-space exists, it can be used for inherent self-calibration for the parallel imaging reconstruction (see Yeh E N, McKenzie C A, Ohliger M A, Sodickson D K (2005) Parallel Magnetic Resonance Imaging with Adaptive Radius in k-space (PARS): Constrained Image Reconstruction using k-space Locality in Radiofrequency Coil Encoded Data. Magn Reson Med 53:1383-1392; and Yeh E N, Stuber M, McKenzie C A, Botnar R M, Leiner T, Ohliger M A, Grant A K, Willig-Onwuachi J D, Sodickson D K (2005) Inherently Self-Calibrating Non-Cartesian Parallel Imaging. Magn Reson Med 54:1-8) and no additional data have to be recorded.

Written informed consent was obtained before each study. All measurements were performed on a 1.5 T scanner (Magnetom Symphony, Siemens) using a 12 channel array coil (6 channel body coil anterior and 6 channel posterior) and 8 receiver channels. Both phantom and in vivo measurements were carried out in transversal slice orientation and the array coils were positioned above and below the object.

Images generated with the PLANED method were compared to conventional Cartesian sampled images with the same spatial resolution and identical parameters, including number of phase encoding steps except for different phase encoding gradients $k_y$. Images were recorded with a standard spin echo sequence (TE=15 ms, TR=525 ms). The raw data matrix was set to 256×512 for the phantom measurement and to 256×256 for the in vivo measurement. The density distribution of the phase encoding direction is presented in FIG. 5. The sampling density followed a cosine square function (Hanning function, H(k)) but was set to ⅓ in the outer part to avoid excessive noise enhancement in the parallel imaging reconstruction:

$w(k)=H(k)$ or ⅓ whichever is larger.

Figure 5:
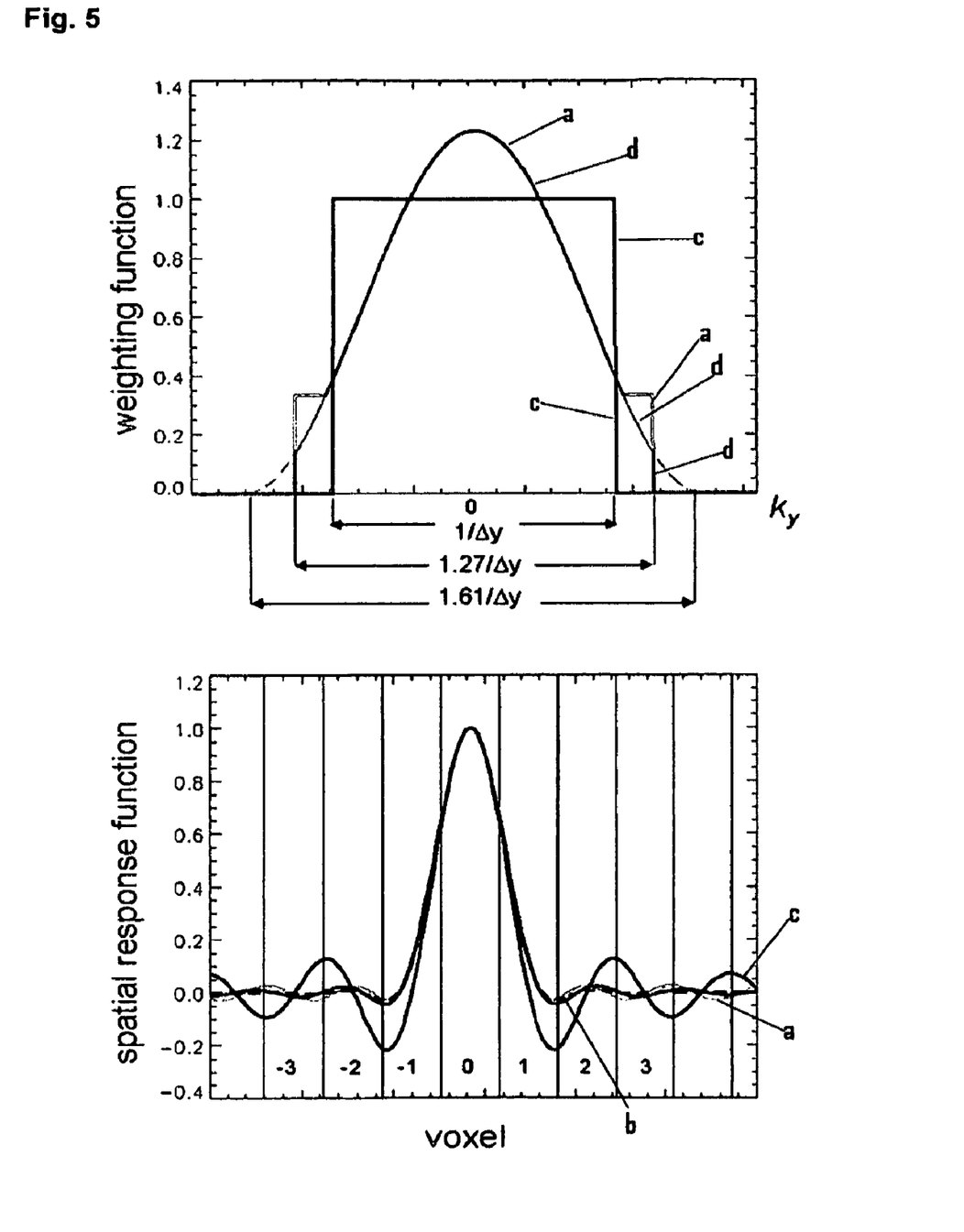
FIG. 5 shows the k-space weighting functions (top) and the corresponding SRFs (bottom) for the sampling of the PLANED experiment (a) and the final filtering (b) compared to a Cartesian experiment (c). The calculated SRFs (bottom) indicate that both experiments have the same spatial resolution. For comparison the original cosine square-function (d) and the corresponding spatial response function (dashed line) are also displayed.

For 256 phase encoding steps w(k) has to be set to ⅓ for $k_y$ for the range indicated in FIG. 5.

PLANED and Cartesian imaging achieve the same spatial resolution, if the widths at 64% of the maximum intensity of their SRFs are equal (see Pohmann R, von Kienlin M (2001) Accurate phosphorous metabolite images of the human heart by 3D acquisition-weighted CSI. Magn Reson Med 45:817-826). Therefore the phase encoding steps of the PLANED experiments were adjusted as described by Pohmann and von Kienlin (see supra Polmann R and von Kienlin M, 2001), i.e. the value for $w_{max}$ and $k_{y,max}$ were chosen larger for the PLANED sampling scheme. These parameters have been calculated to $k_{y,max}=1.61$ and $w_{max}=1.23$ for acquisition weighting in one dimension. This assures that the integral over w(k) yields exactly the same total number of accumulations NA and the same spatial resolution as for the corresponding unweighted Cartesian experiment. FIG. 5 (bottom) displays the SRF for Cartesian, acquisition weighted and PLANED imaging, as it was used in the presented experiments and shows that the different used sampling schemes lead to the same resolution.

To calculate the signal-to-noise ratio two images with identical parameters were recorded for conventional Cartesian imaging and PLANED imaging, respectively. The signal-to-noise ratio within a region of interest was calculated by the ratio of the average and the standard deviation of the difference of both images.

Figure 8:
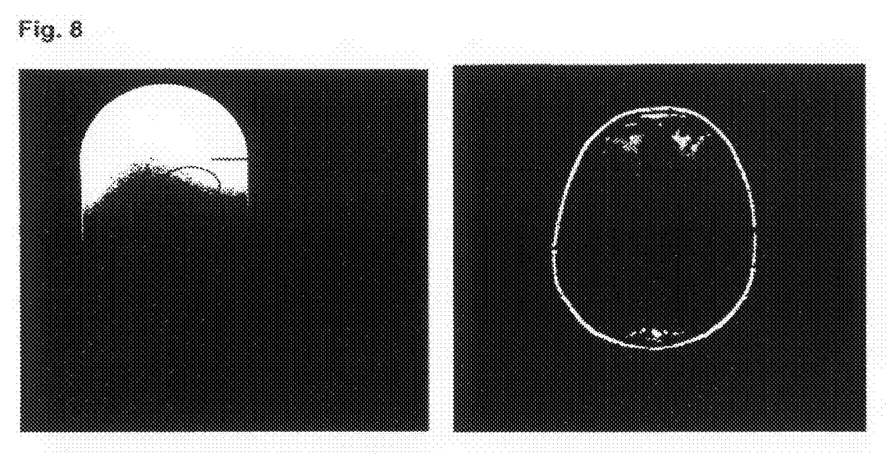
FIG. 8 shows the position of the line where the SRFs shown in FIG. 7 were determined and position of the ROIs for the determination of the SNR.

The point spread function in phase encoding direction was determined as the derivative of the edge spread function. The latter was taken from a row perpendicular to the edge of the phantom as shown in FIG. 8.

Image reconstruction was carried out using custom-built software written in Interactive Data Language (Research Systems Inc., Boulder, Colo., USA). To consider the coil profiles in x-direction the reconstruction process was carried out in the $k_y$-x-space, i.e. before the PLANED reconstruction the signal was Fourier transformed in the direction of the frequency encoding. The reconstruction was performed independently for each position in x-direction. In the oversampled part data were gridded onto a dense Cartesian grid for every coil element using a Kaiser-Bessel-function as it is proposed in (see supra Pipe GP and Menon P, 1999). To reconstruct points for every coil element on a Cartesian grid in the undersampled part a PARS (see supra Yeh E N, McKenzie C A, Ohliger M A, Sodickson D K, 2005) like GRAPPA (see supra Griswold M A et al., 2002) algorithm was applied. To calculate the signal for an aiming point on the Cartesian grid the four closest measured neighbour points were selected and the corresponding distances were determined. Using these distances the GRAPPA factors were determined in the oversampled part of k-space as described in detail below. This allowed the calculation of k-space points on a Cartesian grid fulfilling the Nyquist criterion also in the outer part.

The complete Cartesian k-space, i.e. the gridded inner part and the GRAPPA-reconstructed outer part, was multiplied by a cosine square filter to restore basically the sampled density distribution. The filtered $k_y$-spaces for every coil element were subsequently Fourier transformed and the final image was obtained by taking the square root of the sum of squares of the single coil images.

For every point on a Cartesian grid $k_y$ in the outer part of the k-space GRAPPA reconstruction factors was determined independently. To calculate the signal for every aiming point on the Cartesian grid the $N_b=4$ closest measured neighbour points $k_{y,n1}$, $k_{y,n2}$, $k_{y,n3}$, $k_{y,nr}$) were selected and the corresponding distances were determined ($\Delta k_{y,n1}=k_{y,n1}-k_y$). In the oversampled part the measured data were sinc-interpolated in $k_y$ direction. The measured points in the oversampled part of the k-space were used as auto calibration signals for four interpolated points at the calculated distances. The signal for the coil j at a point $k_y$ is given by $$S_j^{ACS}(k_y) = \sum_{l=1}^{L} \sum_{b=0}^{N_b-1} n(j,b,l) S_l(k_y + \Delta k_{y,nb}),$$

where l is the index of all coils and b denotes the individual neighbour point ($0-N_b-1$). By setting up a system of equations for all measured point in the oversampled part of the k-space the different complex coil weights n(j,b,l) were calculated by a singular value decomposition.

Using these coil weights the signals at Cartesian positions in the undersampled k-space were calculated.

To compare the PLANED method with standard density weighting and to investigate the influence of the aliasing artefacts due to the violation of the Nyquist criterion, the density weighted raw data were also reconstructed without parallel image reconstruction, i.e. using a regridding algorithm for the whole k-space. For this density weighted reconstruction the k-space was weighted by the same function as for the PLANED reconstruction.

Figure 6:
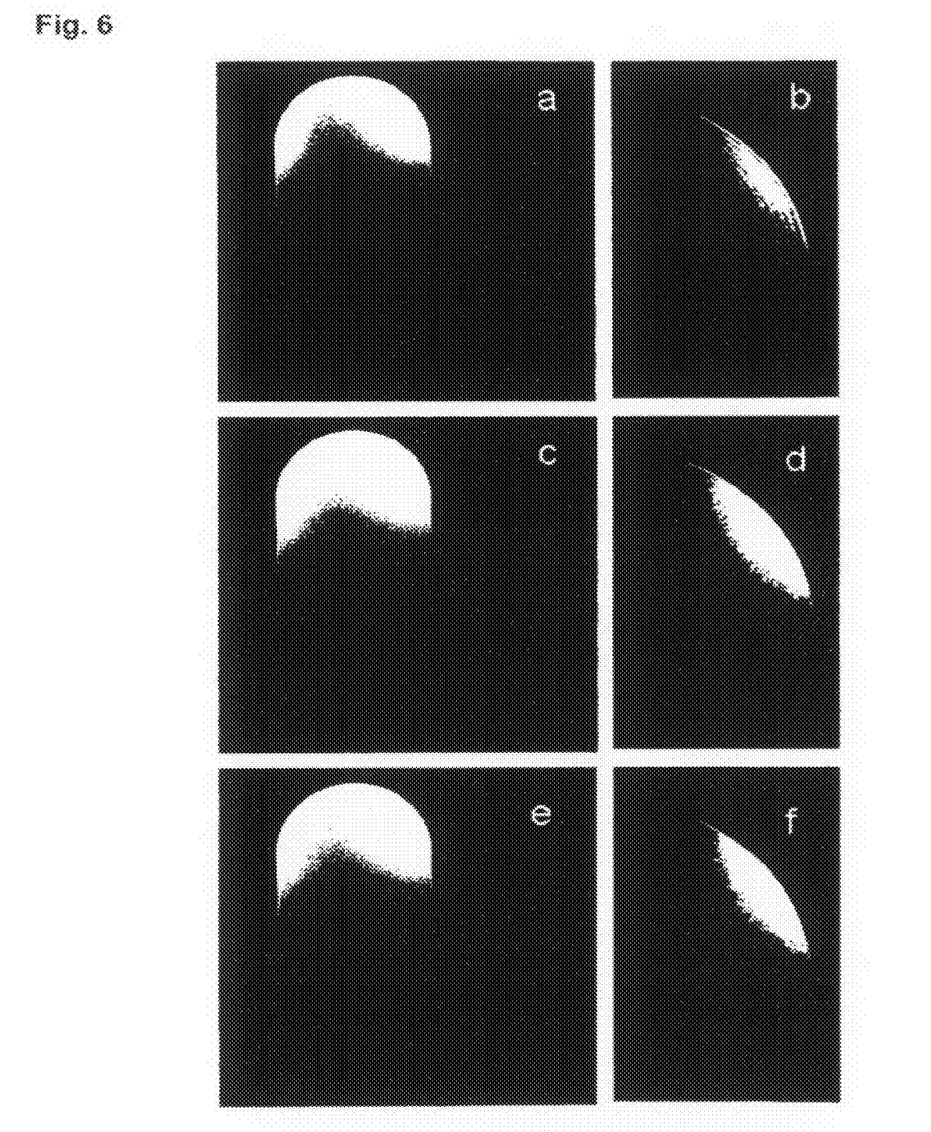
FIG. 6 is a comparison of images recorded with standard Cartesian sampling (a and b), standard density weighted imaging (c and d) and the PLANED technique (e and f). The right column shows the same images zoomed to a quarter of the original image size. Images a, c, e and b, d, f are windowed equally, respectively.

FIG. 6 shows the results of measurements of a test object recorded with the Cartesian, the PLANED and the density weighted technique. For the PLANED and the density weighted image the same raw data were used, but different reconstruction algorithms were applied. The Cartesian image has the lowest SNR and clearly reveals truncation artefacts in phase encoding direction, which can be observed as a line pattern at the edge of the phantom. The PLANED and the density weighted image show no Gibbs ringing in phase encoding direction. Both images exhibit the same SNR, but the density weighted image suffers from undersampling artifacts. These are visible as line patterns in the image at a distance at least ⅓ of the FOV from the signal producing structure. This corresponds to a maximum undersampling of a factor of 3. The best image quality is achieved by the PLANED imaging technique. The improved SRF results not only in the elimination of truncation and undersampling artefacts but also in the increase of SNR, in this example by 34% compared to the Cartesian sampled image.

Figure 7:
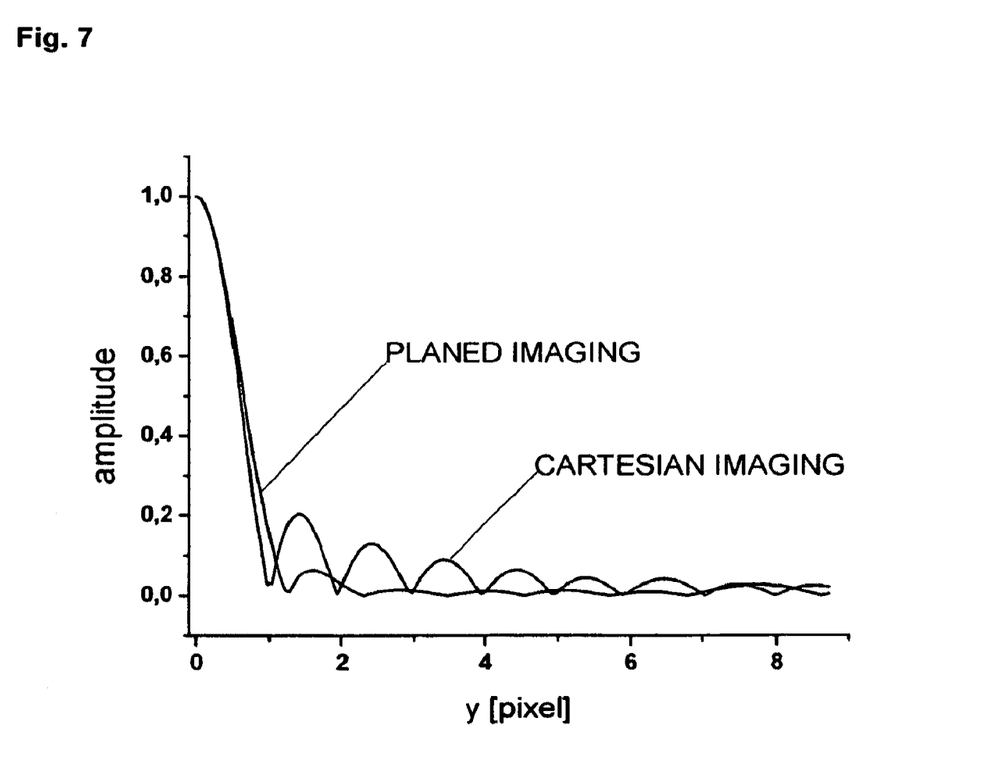
FIG. 7 is a comparison of the measured spatial response functions resulting from the Cartesian image shown in FIG. 6a and the PLANED image in FIG. 6e.

To test whether the spatial resolution $\Delta_y$ is identical for both images, the magnitude of the spatial response function was calculated from the edge spread function in the row indicated by a line in FIG. 8 for the Cartesian and the PLANED imaging technique. The magnitudes of the SRFs are presented in FIG. 7. The results confirm experimentally that within the range of measurement errors both images have the same spatial resolution. Additionally the strong suppression of truncation artefacts for PLANED can be observed in the SRF, too. In contrast to the SRF obtained from the Cartesian image the SRF of the PLANED image shows much less pronounced side lobes.

Figure 9:
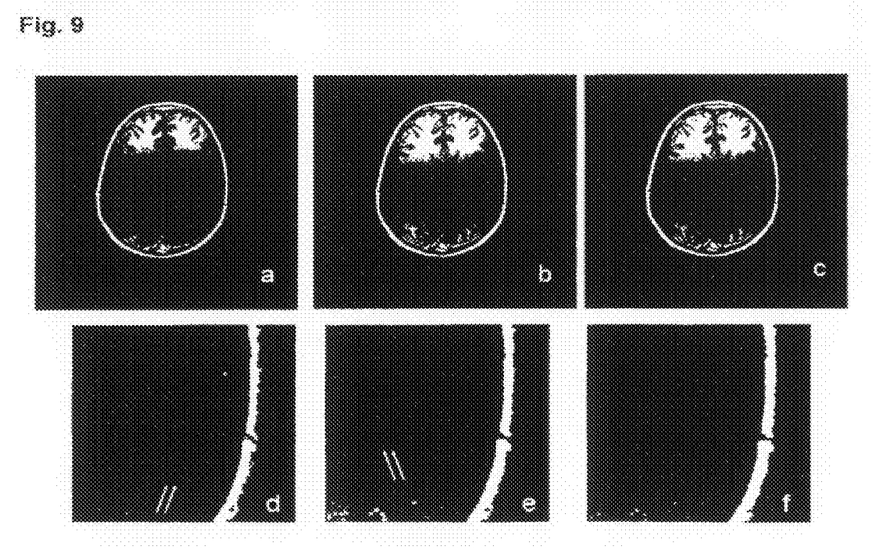
FIG. 9 are in vivo images of the human brain recorded with standard Cartesian sampling (left), standard density weighted imaging (middle) and with the PLANED technique (right). The stripes visible in FIG. 6e can be attributed to undersampling artefacts, whereas in 6d Gibbs ringing is visible.

An in vivo measurement of a human brain is presented in FIG. 9. The Cartesian image again reveals Gibbs ringing in the phase encoding direction. This is not observable in the density weighted image and in the PLANED image. While the density weighted image is corrupted by undersampling artefacts, these are not observable in the image, recorded with the PLANED technique.

The SNR measurements yield an enhancement of 17% for the images obtained by the PLANED method.

The ROIs which were used for the calculation of the SNR, are indicated in FIG. 8.

Figure 10:
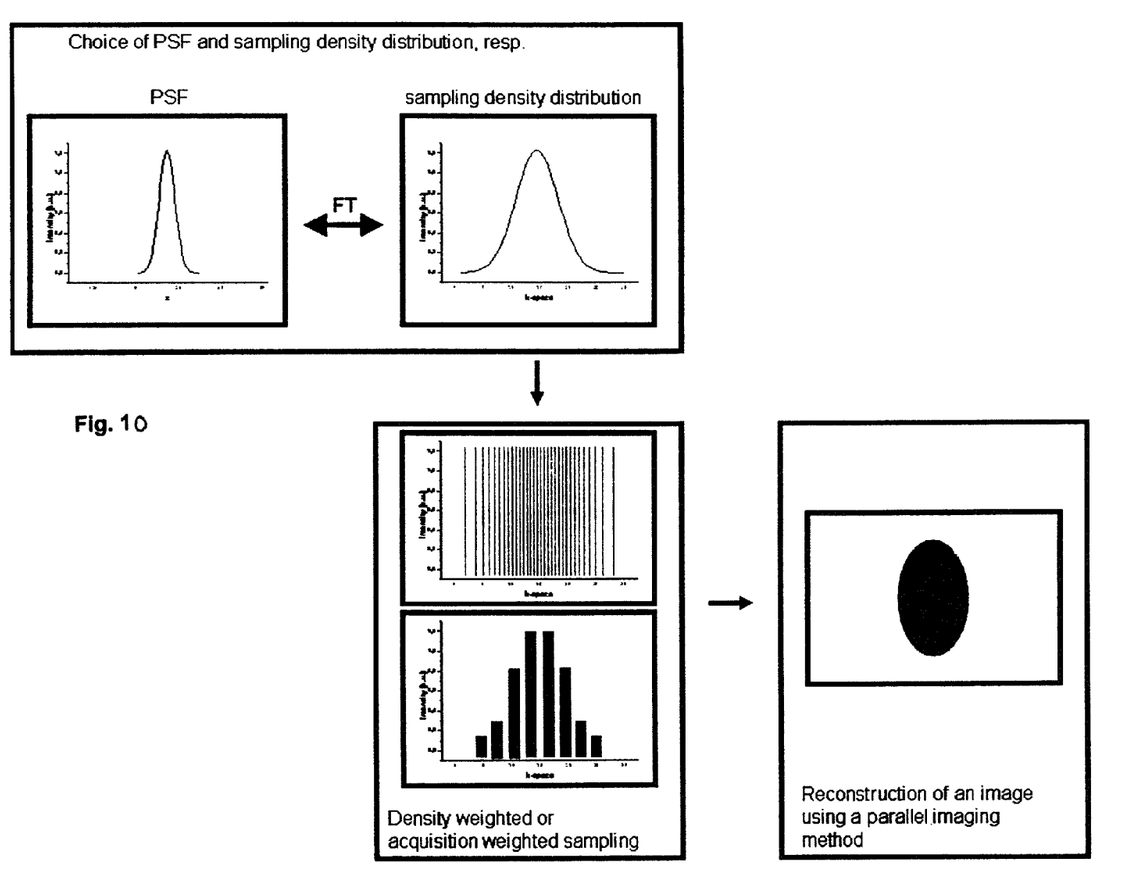
FIG. 10 is a flowchart showing the basic steps of the method according to the invention.

FIG. 10 schematically illustrates the basic steps of the method according to the invention. One first decides whether to use the point spread function (PSF) or the sampling density distribution, which are related to each other by Fourier transformation (FT). Magnetic resonance data are then acquired and entered into k-space according to density weighted sampling or acquisition weighted sampling. As noted above, this results in at least one undersampled region in k-space, for the Nyquist criterion is not fulfilled. In order to overcome problems in the image reconstruction that would otherwise result from this non-fulfillment of Nyquist criterion, an image is reconstructed using a parallel imaging method.

In this work a new technique, parallel acquisition for effective density weighted imaging, is proposed and tested on phantoms and on in vivo applications. The proposed technique suppresses truncation artefacts and enhances considerably the signal-to-noise ratio of MR images of extended samples compared to conventional methods.

Acquisition and density weighted imaging methods have proven their capability to reduce the cross-talk between different pixels. At the same time these methods improve the SNR to an extent depending on the morphological geometry. The SNR gain originates from the suppression of the negative side lobes in the SRF compared to Cartesian imaging. Up to now the use of acquisition and density weighted imaging in clinical routine imaging was hampered by the increased minimum scan time or, if the Nyquist criterion is violated, by aliasing artifacts.

One of the most important technical advances in the last decade was the introduction of parallel imaging techniques. Parallel imaging reconstruction allows to remove aliasing from undersampled data sets at the prize of a SNR amplification of a factor of g (see supra Griswold M A et al., 2002).

In this study the first results of a combination of density weighted and parallel imaging are presented. In the proposed implementation of PLANED imaging the sampling density was chosen according to a slightly modified cosine-square function. A cosine-square function is a common k-space filter function that offers a favourable spatial response function (see supra Mareci T H and Brooker H R, 1991). The sampling density in our experiments was restricted to values larger ⅓ to keep the noise amplification factor (g-factor) by parallel image reconstruction low, even for our not optimized hardware. It could be shown, that the effect of small deviations from the cosine-square filter function on image SNR and SRF is minimal. The filling of the gaps in the sparse k-space was performed by a GRAPPA (see supra Griswold M A et al., 2002), or PARS (see supra Yeh E N, McKenzie C A, Ohliger M A, Sodickson D K, 2005) algorithm. But of course, PLANED imaging is not restricted to the use of the modified cosine-square filter or a GRAPPA reconstruction. Other filter functions like Kaiser-Bessel functions or numerically optimized functions (see supra Jackson J I et al., 1991) for a desired SRF may also be used. This also includes particular applications like edge enhancement filters for certain applications. Likewise the parallel imaging method included in our reconstruction can be substituted by any other parallel imaging technique and calibration method. In the implemented GRAPPA-reconstruction only 4 neighbouring points contributed to the reconstructed k-space points. According to the findings in (see supra Griswold M A et al., 2002) the usage of four neighbouring points results in the same reconstruction quality as a reconstruction with more points. But PLANED reconstruction is not limited to this particular choice. PLANED imaging may certainly profit from modified GRAPPA algorithms where regularization is performed after the singular-value decomposition for large coil arrays (see Lin F H, Kwong K K, Belliveau J W, Wald L L (2004) Parallel Imaging Reconstruction Using Automatic Regularization. Magn Reson Med 53:559-567; and Sodickson D K (2000) Tailored SMASH Image Reconstructions for Robust In Vivo Parallel MR Imaging. Magn Reson Med 44:243-251). But also other parallel techniques working either in the k-space [see supra Jakob P H et al, 1998; Heidemann R et al, 2001; Griswold M A, Blaimer M, Breuer F, Heidemann R M, Mueller M, Jakob P M (2005) Parallel Magnetic Resonance Imaging Using the GRAPPA Operator Formalism. Magn Reson Med 54:1553-1556; and Heidemann R, Griswold M A, Jacob P M (2003) Fast Parallel Image Reconstructions with non-Cartesian Trajectories Proc. Intl. Soc. Mag. Reson. Med 11: 2347], image space [see supra Pruessmann K P et. al, 2001, and Pruessmann K P et. al, 1999) or hybrid techniques see supra Kyriakos W E et al., 2000) can be used in the reconstruction of PLANED imaging. In this study coil sensitivity information was extracted from the densely sampled centre of the k-space. This self calibration can be applied to all cases were at least a part of k-space fulfils the Nyquist criterion. But coil profile information may also be determined in a separate prescan (see supra Pruessmann K P et. al, 1999) or by completely filling a dense k-space in dynamic imaging (see Koesder H, Landschiitz W, Sandstede J, Lipke C, Hahn D (2000) Abstract: Heart perfusion imaging using SENSE Radiology 217 (P) supplement, 464; Kellman P, Epstein F H, Mc Veigh E R (2001) Adaptive sensitivity encoding incorporating temporal filtering (TSENSE), Magn Reson Med 45: 846-852; Köstler H, Sandstede J J W, Lipke C, Landschiitz W, Beer M Hahn D (2003) Auto-SENSE perfusion imaging of the whole human heart. J Magn Reson Imaging 18: 702-708; Köstler H, Beer M, Ritter C, Hahn D, Sandstede J (2004) Auto-sense view-sharing cine cardiac imaging. MAGMA Magn Reson Mater Phy 17:63-67; and Breuer F A, Kellmann P, Griswold P A, Jakob P M (2005) Dynamic autocalibrated parallel imaging using temporal GRAPPA (TGRAPPA). Magn Reson Med 53:981-985).

In the examples presented in this study the spatial resolution and the number of phase encoding steps were kept constant to compare Cartesian and PLANED imaging. But it is also possible to design a PLANED sequence that shows the same spatial resolution and the same SNR as the Cartesian technique. The presented results would correspond to a reduction of the acquisition time by a factor of about 1.4 to 1.8.

PLANED imaging is not restricted to a certain type of pulse sequence, as spin echo imaging. First results using gradient echo PLANED imaging (not shown in this work) indicate that the PLANED principle can be applied to all phase encoded pulse sequence.

The highest impact of PLANED imaging is expected in applications which are limited by the signal to noise ratio. Among these are fMRI studies, where the low SNR results in long acquisition times. But clinical images that SNR limited because they are recorded during breath hold or in real time should profit from the SNR gain in PLANED imaging. A special importance is expected for the application of the PLANED technique for 3D imaging. As in 3D imaging typically two dimensions are phase encoded the SNR gain in PLANED imaging should be squared compared to 2D MR imaging. PLANED imaging may substitute averaging and the need for higher field strength in some applications but it may also be combined with these techniques to allow new applications of MR imaging.

The new proposed technique, PLANED imaging, was applied to phantom and in vivo studies. The results showed that PLANED can improve the image quality by suppressing truncation artefacts and increasing considerably the signal to noise ratio. Thus PLANED opens the way for higher SNR and shorter scan times in most MR imaging applications.

It is an achievable advantage of the present invention to at least partially eliminate undersampling artefacts and to limit the scan time.

The entire content of the literature cited above is incorporated by reference into the present description.

Although modifications and changes may be suggested by those skilled in the art, it is the intention of the inventors to embody within the patent warranted heron all changes and modifications as reasonably and properly come within the scope of their contribution to the art.

We claim as our invention:

1. A method for magnetic resonance imaging, comprising the steps of:
    operating a magnetic resonance apparatus to acquire magnetic resonance data and entering said magnetic resonance data into a memory representing k-space by sampling k-space using an acquisition method selected from the group consisting of density weighted acquisition and acquisition weighted data acquisition, including undersampling at least one region of k-space with respect to the Nyquist criterion, thereby resulting in non-fulfillment of the Nyquist criterion in said undersampled region, to produce a weighted distribution of data in k-space having a point spread function with substantially no side lobes; and
    in a processor, reconstructing a magnetic resonance image from the data in k-space using a parallel magnetic resonance imaging method to reduce an influence of said non-fulfillment of the Nyquist criterion on the reconstructed image, and providing said magnetic resonance image at an output of said processor as an image data file.

2. A method as claimed in claim 1 comprising reconstructing said magnetic resonance image using an algorithm selected from the group consisting of SMASH, Auto-SMASH, VD-Auto-SMASH, GRAPPA, and GRAPPA-operator algorithms.

3. A method as claimed in claim 1 comprising, in said parallel magnetic resonance imaging method, reconstructing said magnetic resonance image in real-space using an algorithm selected from the group consisting of SENSE, Auto-SENSE, mSENSE, T-SENSE and PILS algorithms.

4. A method as claimed in claim 1 comprising, in said parallel imaging method, reconstructing said magnetic resonance image in real-space and in k-space.

5. A method as claimed in claim 4 comprising using a SPACE-RIP method as said parallel imaging method.

6. A method as claimed in claim 1 comprising implementing spectroscopic imaging with said parallel imaging method.

7. A method as claimed in claim 1 comprising implementing chemical shift imaging using said parallel imaging method.

* * * * *